United States Patent [19]

Bernier

[11] Patent Number: 5,473,170
[45] Date of Patent: Dec. 5, 1995

[54] SEMICONDUCTOR PROTECTION COMPONENT

[75] Inventor: Eric Bernier, Tours, France

[73] Assignee: SGS-Thomson Microelectronics, S.A., Pouilly, France

[21] Appl. No.: 280,142

[22] Filed: Jul. 25, 1994

Related U.S. Application Data

[63] Continuation of Ser. No. 976,263, Nov. 13, 1992, abandoned.

[30] Foreign Application Priority Data

Nov. 15, 1991 [FR] France ................................ 91 14445

[51] Int. Cl.⁶ ........................ H01L 29/74; H01L 29/06; H01L 29/78
[52] U.S. Cl. ...................... 257/174; 257/109; 257/110; 257/111; 257/173
[58] Field of Search ................................ 257/109, 110, 257/111, 112, 173, 174

[56] References Cited

U.S. PATENT DOCUMENTS

| | | | |
|---|---|---|---|
| 4,060,825 | 11/1977 | Schlegel | 257/109 |
| 4,599,633 | 7/1986 | Thire et al. | 257/109 |

FOREIGN PATENT DOCUMENTS

| | | | |
|---|---|---|---|
| 0167440 | 1/1986 | European Pat. Off. | |
| 2833917 | 2/1979 | Germany . | |
| 61-202465 | 9/1986 | Japan | 257/112 |
| 3-239367 | 10/1991 | Japan | 257/109 |
| 2208257 | 3/1989 | United Kingdom . | |

*Primary Examiner*—Ngân V. Ngô
*Attorney, Agent, or Firm*—Wolf, Greenfield & Sacks

[57] ABSTRACT

A gateless thyristor or a gateless triac with shorting holes having a sharp switching threshold and a high current value $I_H$ includes, a first area having a first density of shorting holes and a second area having a second density of shorting holes lower than the first density.

9 Claims, 3 Drawing Sheets

SEMICONDUCTOR PROTECTION COMPONENT

This application is a continuation, of application Ser. No. 07/976,263, filed Nov. 13, 1992 now abandoned.

TECHNICAL FIELD

The present invention relates to semiconductor components for protection against overvoltages. Such semiconductor components become conductive as soon as the voltage across their terminals exceeds a predetermined threshold.

BACKGROUND ART

The invention relates to gateless thyristors (for unidirectional protection) or gateless triacs (for bidirectional protection), that is, structures including four semiconductor layers of alternate NPNP conductivity types. In these gateless components, conduction occurs because of the breakdown of the junction between the central layers of the structure. This avalanche mode generally occurs first in a localized area then progressively extends throughout the component.

As shown in FIG. 1A, such a component is essentially formed by superimposed semiconductor layers of alternate conductivity types which are, respectively, between a first main surface and a second main surface: an N-type cathode layer N1, a P-type gate layer P1, a middle N-type layer N2, and a P-type anode layer P2. The cathode and anode layers are respectively coated with metallizations M1 and M2. Generally, the structure includes "shorting" holes CC distributed beneath the cathode metallization. Through these holes, gate layer P1 crosses the cathode layer N1 to the cathode metallization. These shorting holes are sometimes called emitter shorts.

FIGS. 1B and 1C are exemplary top views of the component of FIG. 1A in the absence of metallization M1 to better illustrate shorting holes CC. These figures show two conventional shorting hole arrangements, disposed so as to form respectively a square and a triangle, or an oblique pattern. Characteristic features of these holes are the distance D between two adjacent holes (assuming that all the holes are equidistant) and the diameter d of each hole (assuming that all the holes have an equal diameter).

Those skilled in the art can, from a unidirectional protection component of the gateless thyristor-type, such as illustrated in FIG. 1A, form a bidirectional protection component of the gateless triac-type by disposing in a single monolithic structure two reversely connected gateless thyristors of the type shown in FIG. 1A.

Furthermore, it will be noted that FIGS. 1A, 1B and 1C are partial views and do not show the component edges for which conventional processing steps are required to have a suitable breakover voltage.

FIGS. 2 and 3 are characteristic curves of a conventional protection component of the gateless thyristor-type. These curves correspond to unidirectional components. The characteristic curves of bidirectional components can be immediately deduced since they are symmetrical with respect to the origin.

FIG. 2 shows the curve of current I as a function of voltage V of a conventional gateless thyristor. As long as the applied voltage remains lower than a threshold value $V_{BR}$, the device is in a blocking mode and no current flows. When overvoltage occurs and voltage increases from value $V_{BR}$ and approaches value $V_{BO}$, current starts flowing in the component in accordance with a characteristic curve A. When the applied voltage exceeds $V_{BO}$, the characteristic curve becomes curve B and the operation point is fixed to a low voltage value $V_{ON}$ and to a current $I_{ON}$ which is determined by the characteristics of the power supply and of the circuit. When the overvoltage disappears, current in the component decreases down to a hold current value $I_H$. When the current becomes lower than $I_H$, the component returns to the blocking mode.

The characteristic curve illustrated in FIG. 2 exemplifies static phenomena. FIG. 3 shows the shape of current I and voltage V as a function of time in a component of the gateless thyristor-type subjected to a voltage surge. The voltage very rapidly goes from a substantially zero voltage to $V_{BR}$. Then, dynamic phenomena cause the voltage to increase beyond value $V_{BR}$ before decreasing again to this value then to value $V_{ON}$. The current increase occurs with an initial substantially linear slope, dI/dt. Although the current and voltage curves are superimposed, they are not drawn to the same time scale. For example, value $V_{BO}$ is reached within a time period lower than 1 microsecond, while time $t_1$, at the end of which the current reaches a maximum value IPP, can be approximately 10 microseconds, and time $t_2$, at the end of which the current has decreased to value IPP/2, can be approximately 100 microseconds.

The major characteristics of a protection component are:

- the difference between values $V_{BR}$ and $V_{BO}$ determines the triggering precision of the device;
- the dynamic surge over value $V_{BR}$ must be as low as possible;
- the value of dI/dt that the component can withstand must be as high as possible; that is, the component must be capable of withstanding high current densities while switching on;
- the value of the hold current $I_H$ which must be relatively high. In practice, in a protection component, it is desired, once overvoltage has disappeared, that the circuit coupled to the protection component resumes operating as soon as possible. If the value of the hold current $I_H$ is too low, the protection component remains conductive when the overvoltage has disappeared.

It is known that the shorting hole density affects these various parameters. If this density increases, one obtains an advantageous effect, namely, the hold current $I_H$ increases, and adverse effects, namely, the static and dynamic values of $V_{BO}$ increase and the value of dI/dt that the component can withstand decreases.

Thus, in the prior art, mean density values of the shorting holes are selected so as to provide a satisfactory compromise between these various effects.

In thyristor or triac structures including a control gate, the density of the shorting holes has been modified at the vicinity of the gate area.

SUMMARY OF THE INVENTION

An object of the invention is to provide a protection component of the gateless thyristor or triac type, which provides improved characteristics in terms of decreasing the value $V_{BO}$, both in the static and dynamic state, without decreasing value $I_H$.

To achieve this object, the invention provides a protection component of the gateless thyristor or triac type with shorting holes, including a first area having a first shorting hole density and a second area having a second shorting hole density less than the first density.

According to an embodiment of the invention, the component further comprises an overdoped area at the interface between its middle layer and its gate layer in register with the second area.

According to an embodiment of the invention, all the shorting holes have the same size and are disposed further away from each other in the second area than in the first area.

According to an embodiment of the invention, all the shorting holes have the same pitch and are smaller in the second area.

According to an embodiment of the invention, the component comprises a first pattern of shorting holes having a regular pitch and additional shorting holes in the first area, the additional holes having a smaller diameter than the first ones.

According to an embodiment of the invention, the second area is disposed substantially in the middle of the first.

The foregoing and other objects, features, aspects and advantages of the invention will become apparent from the following detailed description of the present invention which should be read in conjunction with the accompanying drawings.

Figure 1A:
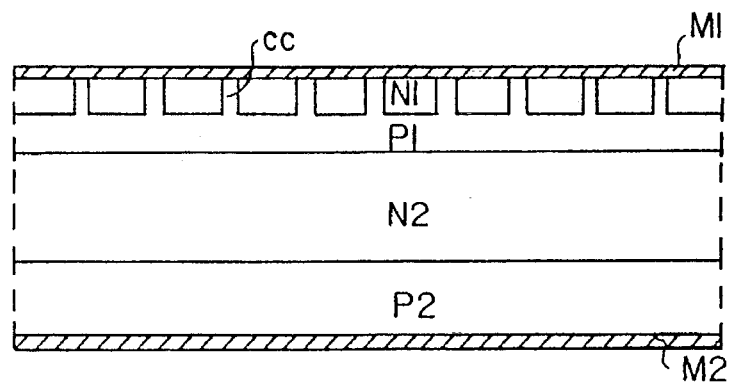
FIG. 1A to FIG. 3, above described, illustrate the state of the art and the problems encountered.

In the various figures, like reference characters designate like or analogous elements. Moreover, as conventional in semiconductor representation, the various cross-sectional or top views of FIGS. 1A–1C and 4A–5 are not drawn to scale, the thickness and surface of the layers being arbitrarily enlarged to facilitate the legibility of the drawings.

DETAILED DESCRIPTION

Figure 1B:
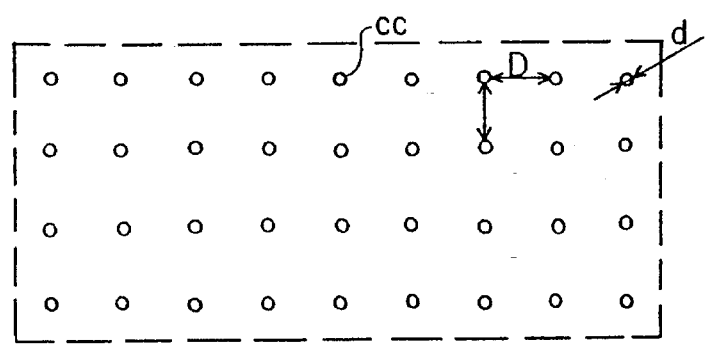
Figure 4A:
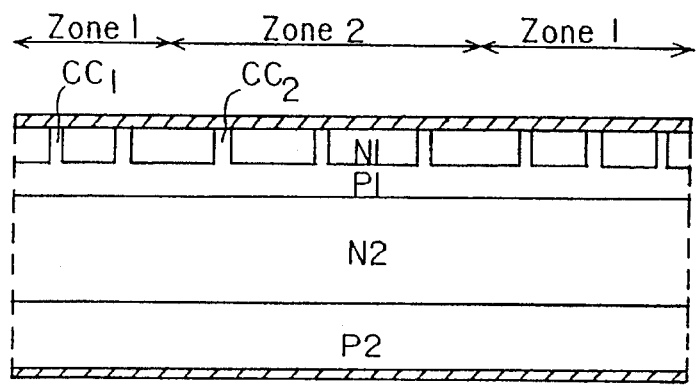
FIG. 4A is a schematic cross-sectional view taken along line A—A in FIG. 4B of a protection component according to the invention.
Figure 4B:
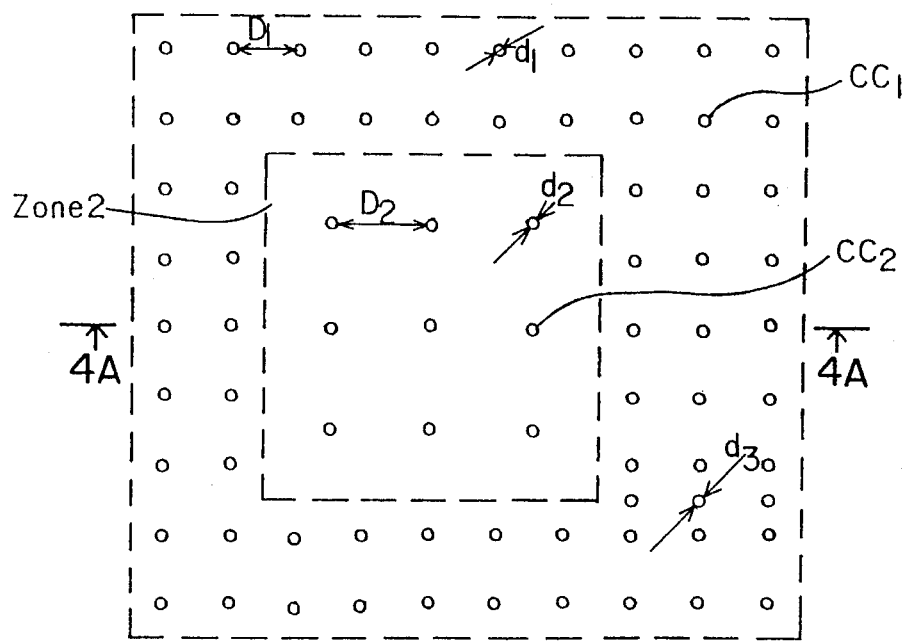
FIG. 4B is a partial top view of the component of FIG. 4A.

As shown in FIGS. 4A and 4B, the invention relates to a protection component of the gateless thyristor-type, basically similar to the one illustrated in FIGS. 1A and 1B. In the component of the invention, two distinct areas are provided at the surface wherein the densities of the shorting holes are different. In zone 1, the density of the shorting holes CC1 is relatively high (compared to zone 2) and in zone 2, the density is lower than in zone 1. Preferably, zone 2 is disposed in the middle of the device.

Figure 3:
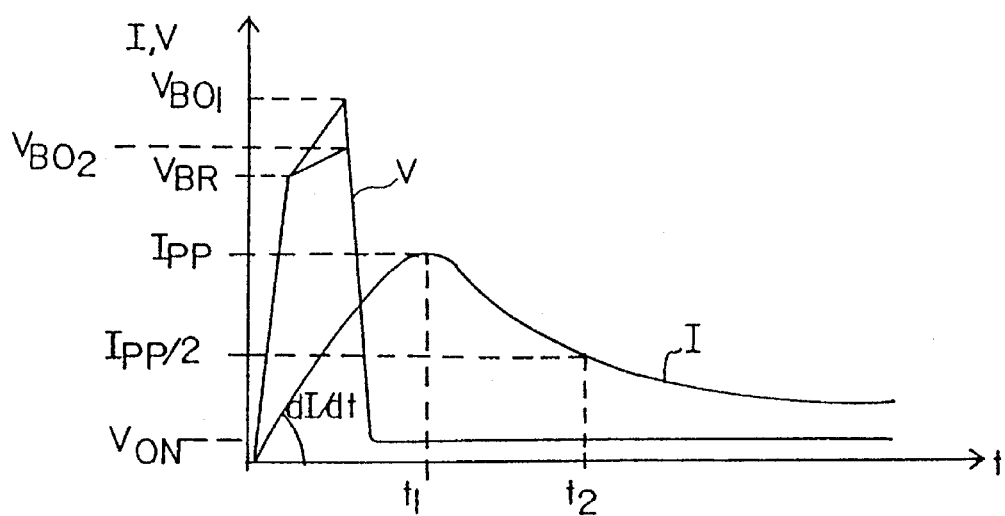

The applicant has found that these zones differently affect the above-mentioned characteristics. Zone 2 with the lower density of shorting holes (CC2) essentially determines the parameters of the conduction mode of the component and therefore makes it possible to decrease the values of $V_{BO}$ in the static and the dynamic state (the characteristic curve corresponding to value $V_{BO2}$ illustrated in FIG. 3 will be obtained). However, it is zone 1 with the higher density of shorting holes (CC1) which essentially determines the turn off features of the component and therefore will result in a higher value of $I_H$. Thus, with the invention, a decreased value VB0 in the static and the dynamic state is obtained while maintaining a hold current $I_H$ identical to the current of a conventional structure.

Figure 1C:
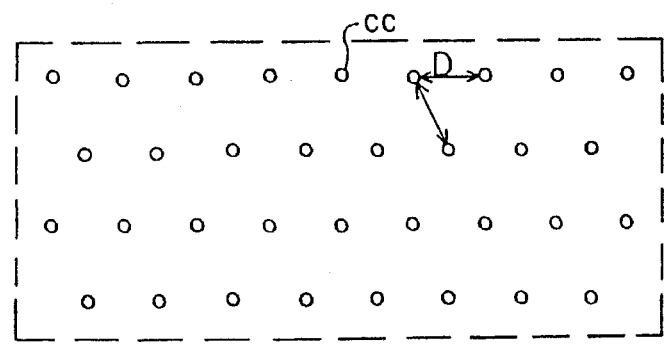
Figure 2:
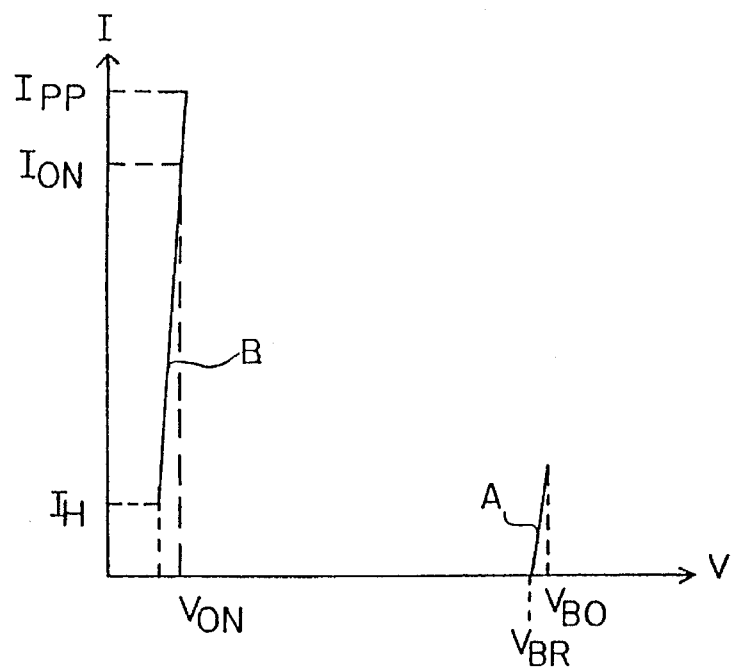

In FIG. 4B is shown an embodiment of the invention wherein all the shorting holes have an equal diameter d and are spaced apart by a distance D1 in zone 1 and by a distance D2, higher than D1, in zone 2 in a configuration similar to the configuration of FIG. 1B in which the holes are arranged in a square pattern. The holes could also be arranged, as shown in FIG. 1C, in a triangular pattern.

Those skilled in the art will be able to provide various variants of the invention, for example holes in zone 2 having the same pitch as the holes of zone 1 but with a smaller diameter D2 than the diameter D1 of holes in zone 1; or holes having the same pitch with the provision of additional holes in zone 1, that may have a smaller diameter D3.

Additionally, the shorting holes are not necessarily circular, but may be any appropriate shape depending on manufacturing processes and so on.

Figure 5:
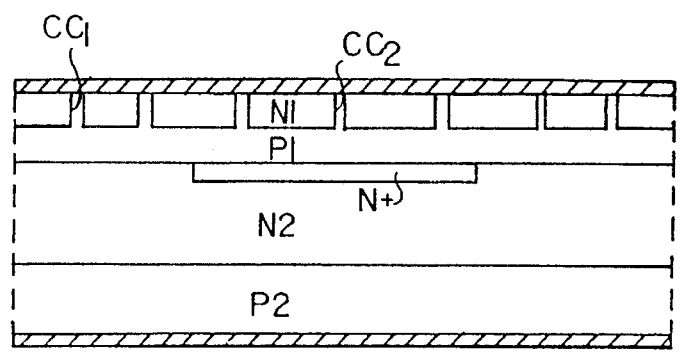
FIG. 5 shows an alternative embodiment of the invention.

The invention can also be combined with various known improvements in gateless thyristor structures. For example, as shown in FIG. 5, one can provide a preferential breakdown zone obtained by an $N^+$ region arranged at the interface between regions P1 and N2. In this case, region $N^+$ will be arranged in zone 2 where the density of the shorting holes is lower. Since the triggering is already performed in the bulk at the vicinity of region $N^+$, the invention will, for a predetermined hold current, improve the component's ability to withstand the triggering energy by decreasing the value of $V_{BO}$ in the static and the dynamic state and the corresponding current $I_{BO}$. This is very significant since the overvoltages that are likely to occur are short and therefore the values of dI/dt and dV/dt are high.

Having thus described one particular embodiment of the invention, various alterations, modifications, and improvements will readily occur to those skilled in the art. Such alterations, modifications, and improvements as are made obvious by the disclosure are intended to be part of this disclosure though not expressly stated herein, and are intended to be within the spirit and scope of the invention. Accordingly, the foregoing description is by way of example only and is not intended as limiting. The invention is limited only as defined in the following claims and the equivalents thereto.

I claim:

1. A semiconductor protection component, comprising:

gate layer;

a cathode layer disposed on the gate layer, the cathode layer having a first surface, and a plurality of shorting holes through the cathode layer for coupling the gate layer to the first surface wherein the shorting holes include portions of the gate layer;

a first zone of the protection component having a first density of shorting holes; and a second zone of the protection component having a second density of shorting holes, wherein the second density is different from the first density;

wherein the first zone substantially determines a first set of electrical characteristics of the component, and the second zone substantially determines a second set of electrical characteristics of the component, the first set of characteristics being different from the second set of characteristics; and wherein a pitch of the shorting holes in the first zone equals a pitch of the shorting holes in the second zone and the shorting holes in the second zone have a diameter less than a diameter of the shorting holes in the first zone.

2. A semiconductor protection component, comprising:

a gate layer;

a cathode layer disposed on the gate layer, the cathode layer having a first surface, and a plurality of shorting holes through the cathode layer for coupling the gate layer to the first surface wherein the shorting holes include portions of the gate layer;

a first zone of the protection component having a first density of shorting holes; and a second zone of the protection component having a second density of shorting holes, wherein the second density is different from the first density;

wherein the first zone substantially determines a first set of electrical characteristics of the component, and the second zone substantially determines a second set of electrical characteristics of the component, the first set of characteristics being different from the second set of characteristics; and wherein a pitch of a first group of shorting holes in the first zone equals a pitch of shorting holes in the second zone and further comprising an additional group of shorting holes having a diameter less than a diameter of the first group of shorting holes disposed in the first zone.

3. A semiconductor protection component, comprising:

a gate layer;

a cathode layer, having a first surface, disposed on the gate layer;

shorting hole means for coupling the gate layer to the first surface comprising at least a portion of the gate layer;

a first zone of the protection component having a first density of shorting holes; and a second zone of the protection component having a second density of shorting holes, wherein the second density is different from the first density;

wherein the first zone substantially determines a first set of electrical characteristics of the component, and the second zone substantially determines a second set of electrical characteristics of the component, the first set of characteristics being different from the second set of characteristics; and wherein a pitch of the shorting holes in the first zone equals a pitch of the shorting holes in the second zone and the shorting holes in the second zone have a diameter less than a diameter of the shorting holes in the first zone.

4. A semiconductor protection component, comprising:

a gate layer a cathode layer, having a first surface, disposed on the gate layer;

shorting hole means for coupling the gate layer to the first surface comprising at least a portion of the gate layer;

a first zone of the protection component having a first density of shorting holes; and a second zone of the protection component having a second density of shorting holes, wherein the second density is different from the first density;

wherein the first zone substantially determines a first set of electrical characteristics of the component, and the second zone substantially determines a second set of electrical characteristics of the component, the first set of characteristics being different from the second set of characteristics; and wherein a pitch of a first group of shorting holes in the first zone equals a pitch of shorting holes in the second zone and further comprising an additional group of shorting holes having a diameter less than a diameter of the first group of shorting holes disposed in the first zone.

5. In a gateless semiconductor protection component including a gate layer, a cathode layer, having a first surface, disposed on the gate layer and a plurality of shorting holes through the cathode layer for coupling the gate layer to the first surface, wherein the shorting holes include portions of the gate layer, the improvement comprising:

a first zone of the cathode layer having a first density of shorting holes and a second zone having a second density of shorting holes, wherein the second density is lower than the first density, and wherein the second zone is surrounded by the first zone.

6. A semiconductor protection component, comprising:

a gate layer;

a cathode layer disposed on the gate layer, the cathode layer having a first surface, and a plurality of shorting holes through the cathode layer for coupling the gate layer to the first surface wherein the shorting holes include portions of the gate layer;

a first zone of the cathode layer having a first density of shorting holes; and a second zone of the cathode layer having a second density of shorting holes, wherein the second density is different from the first density;

wherein the first and second zones are constructed and arranged to yield a low breakover voltage, a low hold current, and a high dI/dt of the component;

wherein the density of shorting holes is greater in the first zone, and wherein the second zone is surrounded by the first zone.

7. The component of claim 6, wherein the first and second zones are coaxially aligned.

8. A semiconductor protection component, comprising:

a gate layer;

a cathode layer, having a first surface, disposed on the gate layer;

shorting hole means for coupling the gate layer to the first surface comprising at least a portion of the gate layer;

a first zone of the cathode layer having a first density of shorting holes;

a second zone of the cathode layer having a second density of shorting holes, wherein the second density is different from the first density; and means for selecting the first and second densities and relative positions of the first and second zones to provide the semiconductor protection component with a low breakover voltage, a low hold current, and a high turn-on dI/dt;

wherein the density of shorting holes is greater in the first zone; and wherein the second zone is surrounded by the first zone.

9. The component of claim 8, wherein the first and second zones are coaxially aligned.

* * * * *

UNITED STATES PATENT AND TRADEMARK OFFICE
CERTIFICATE OF CORRECTION

PATENT NO. : 5,473,170
DATED : December 5, 1995
INVENTOR(S) : Eric Bernier

It is certified that error appears in the above-indentified patent and that said Letters Patent is hereby corrected as shown below:

Title page, item [73], Assignee: should read--SGS-Thomson Microelectronics, Saint Genis, Pouilly, France--.

Signed and Sealed this

Ninth Day of April, 1996

Attest:

BRUCE LEHMAN

Attesting Officer

Commissioner of Patents and Trademarks